Figure 1:
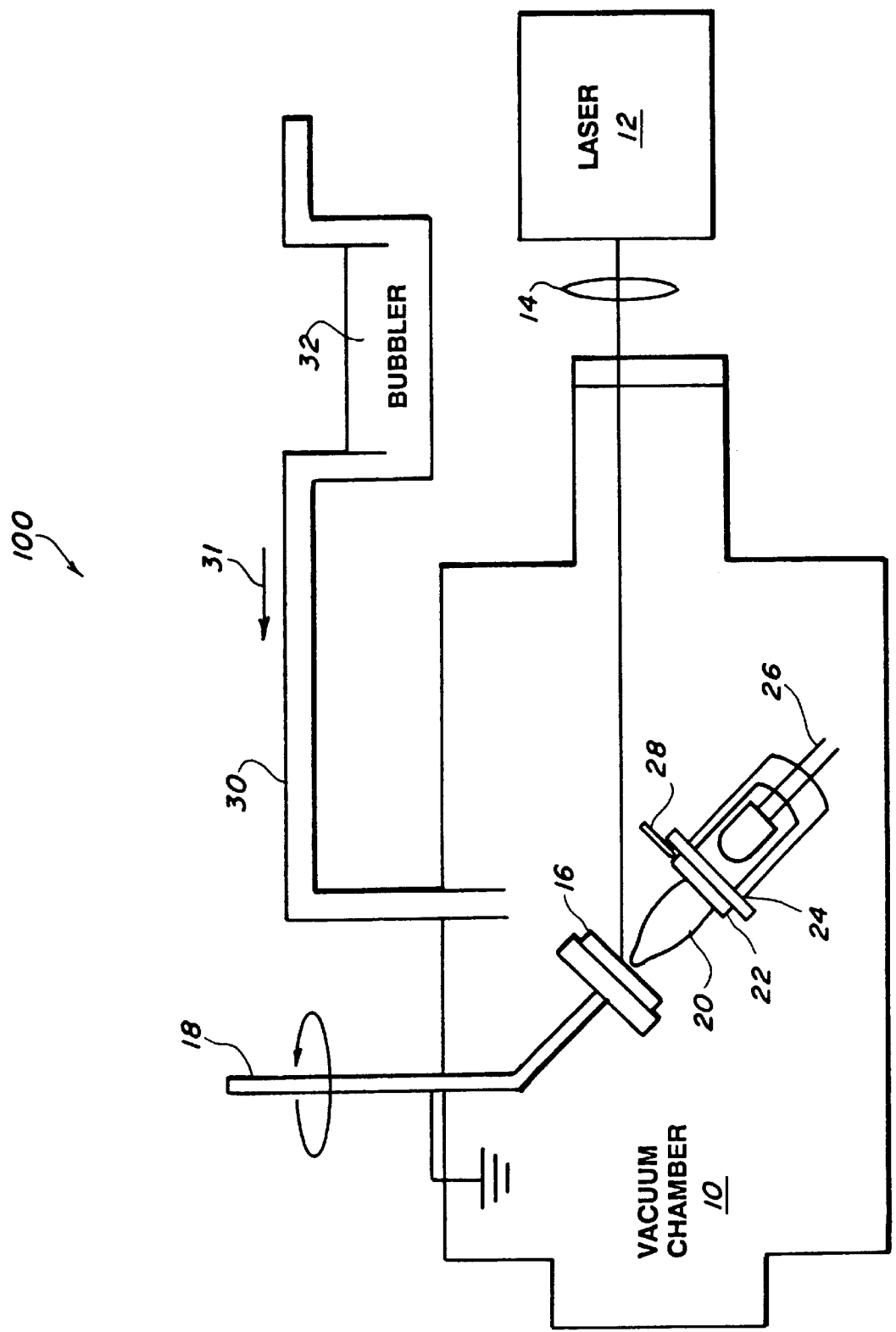

United States Patent [19]
McGill et al.

[11] Patent Number: 6,025,036
[45] Date of Patent: Feb. 15, 2000

[54] METHOD OF PRODUCING A FILM COATING BY MATRIX ASSISTED PULSED LASER DEPOSITION

[75] Inventors: Robert Andrew McGill, Woodbridge, Va.; Douglas Brian Chrisey, Bowie, Md.

[73] Assignee: The United States of America as represented by the Secretary of the Navy, Washington, D.C.

[21] Appl. No.: 08/864,320

[22] Filed: May 28, 1997

[51] Int. Cl.[7] ...................................................... C08F 2/46
[52] U.S. Cl. ............................. 427/492; 427/8; 427/249; 427/255.6; 427/256; 427/294; 427/407.1; 427/509; 427/510; 427/555; 427/559; 427/586; 427/596; 427/600
[58] Field of Search ..................................... 427/509, 510, 427/555, 559, 586, 596, 249, 255.6, 294, 600, 492, 256, 407.1

[56] References Cited

U.S. PATENT DOCUMENTS

| | | | |
|---|---|---|---|
| 4,206,294 | 6/1980 | Tanaka | 427/53.1 |
| 4,312,228 | 1/1982 | Wohltjen | 73/597 |
| 4,895,017 | 1/1990 | Pyle | 73/24.06 |
| 4,920,264 | 4/1990 | Becker | 250/282 |
| 5,118,937 | 6/1992 | Hillenkamp et al. | 250/282 |
| 5,135,870 | 8/1992 | Williams | 436/173 |
| 5,192,580 | 3/1993 | Blanchet-Fincher | 427/596 |
| 5,288,528 | 2/1994 | Blanchet-Fincher | 427/596 |

OTHER PUBLICATIONS

Ogale, S. B., "Deposition of Polymer Thin Films by Laser Ablation", in Pulsed Laser Deposition of Thin Films, Chrisey, D. B. and Hubler, G.K., Eds. John Wiley & Sons, New York, 1994, Chapter 25; (no month avail.).

Hansen S. G. and Robitaille, T. E., "Formation of Polymer Films by Pulsed Laser Evaporation" Appl. Phys. Lett. 52 (1), Jan. 4, 1988, 81–83.

Blanchet, G.B., "Deposition of Amorphous Fluoropolymers Thin Films by Laser Ablation" Appl. Phys Lett. 62 (5), Feb. 1, 1993, 479–481.

Kale et al, "Deposition of Polyphenylene Sulphide (PPS) Polymer by Pulsed Excimer Laser Ablation", Materials Letters 15 (1992) 260–263; (No month avail.).

Kale et al "Degradation of $Y_1Ba_2Cu_3O_{7-x}$ Thin Epitaxial Films in Aqueous Medium and Control of Degradtion Using Polymer Overlayers Deposited by Pulsed Excimer Laser" Thin Solid Films 206 (1991) 161–164. (no month avail.).

*Primary Examiner*—Bernard Pianalto
*Attorney, Agent, or Firm*—Thomas E. McDonnell; Ralph T. Webb

[57] ABSTRACT

A film of a coating material is produced on a substrate by a pulsed laser deposition method in which the material that forms the coating material is first combined with a matrix material to form a target. The target is then exposed to a source of laser energy to desorb the matrix material from the target and lift the coating material from the surface of the target. The target and the substrate are oriented with respect to each other so that the lifted coating material is deposited as a film upon said substrate. The matrix material is selected to have the property of being more volatile than the coating material and less likely than the coating material to adhere to the substrate. The matrix material is further selected as having the property such that when the target is exposed to a source of laser energy, the matrix material desorbs from the target and lifts the coating material from the surface of the target. In another aspect of the invention, a method of making an improved chemical or biochemical sensing device that includes a chemoselective or bioselective coating on a substrate is carried out by coating the substrate by pulsed laser deposition.

28 Claims, 3 Drawing Sheets

METHOD OF PRODUCING A FILM COATING BY MATRIX ASSISTED PULSED LASER DEPOSITION

BACKGROUND OF THE INVENTION

1. Field of the Invention

The invention relates generally to the production of film coatings and more specifically to the production of film coatings of sorbent materials by matrix assisted pulsed laser deposition.

2. Description of the Related Art

Chemical sensors commonly use coatings of chemoselective materials to effect the detection of chemical analytes. Chemoselective materials are substances that are chosen for their ability to interact with specific chemical analytes. A typical chemical sensing device includes a substrate transducer, a thin film coating of a chemoselective material on the substrate and a means for detecting the interaction of the chemoselective material with a chemical analyte. In a surface acoustic wave (SAW) device, the substrate is typically a piezoelectric material that is used to propagate a surface acoustic wave between sets of interdigitated electrodes. In a SAW chemical sensor, the chemoselective material is coated on the surface of the transducer. When a chemical analyte interacts with a chemoselective material coated on the substrate, the interaction results in a change in a physical characteristic of the coating which results in a detectable change in the SAW properties such as the amplitude or velocity of the propagated wave. The detectable changes in the characteristics of the wave indicates the presence of the chemical analyte. SAW devices are described in numerous patents and publications including U.S. Pat. No. 4,312,228 to Wohltjen and U.S. Pat. No. 4,895,017 to Pyke, the disclosures of which are hereby incorporated by reference. Other types of chemical sensors known in the art that use chemoselective coatings include bulk acoustic wave (BAW) devices, plate acoustic wave devices, interdigitated microelectrode (IME) devices, and optical waveguide (OW) devices, electrochemical sensors, and electrically conducting sensors.

The operating performance of a chemical sensor that uses a chemoselective film coating is greatly affected by the thickness, uniformity and composition of the coating. For some chemical sensor technologies, the sensitivity of the sensor to a chemical analyte increases with increasingly thicker coatings. However, for some types of sensors, increasing the coating thickness has a detrimental effect on the sensitivity. In these types of sensors, only the portion of the coating immediately adjacent to the transducer substrate is sensed by the transducer. If the coating thickness is too thick, the outer layers of the coating material, that is, the layers farthest away from the substrate, are not sensed. These outer layers of coating material compete for the analyte with the layers of coating being sensed and thus reduce the sensitivity of the chemical sensor. Further, as the thickness of the chemoselective coating is increased, the time taken for an analyte to diffuse into the coating and come to thermodynamic equilibrium is increased and hence the time taken to reach an equilibrium sensing signal is increased. Thus, the thickness of the coating is a critical factor in the performance of real time monitoring chemical sensors, affecting the response time, recovery time and response magnitude of the sensor. Uniformity of the coating is also a critical factor in the performance of a sensor that uses a chemoselective coating. In this regard, it is important not only that the coating be uniform and reproducible from one device to another, so that a set of devices will all operate with the same sensitivity, but also that the coating on a single device be uniform across the active area of the substrate. If a coating is non-uniform, the response time to analyte exposure and the recovery time after analyte exposure are increased and the operating performance of the sensor is impaired. The thin areas of the coating respond more rapidly to an analyte than the thick areas. As a result, the sensor response signal takes longer to reach an equilibrium value, and the results are less accurate than they would be with a uniform coating. Further, in a chemical sensing device that uses acoustic wave energy in the detection of interactions between a chemoselective coating and analyte molecules, a non-uniform coating causes a greater amount of insertion loss of the acoustic signal than does a uniform coating. Insertion loss is caused by the loss of wave energy to the coating, for example, in the form of heat. This loss is exacerbated by irregularities of the coating surface. If insertion loss can be reduced by providing a more uniform coating, it would be possible then to increase the thickness of the coating without significantly impairing the operational ability of the device. Further, by reducing the insertion loss by producing a more uniform coating, a device may functionally operate with a larger dynamic operating range. An additional advantage to having a more uniform coating is that the coating is less likely than a nonuniform coating to delaminate from the substrate surface.

Conventional methods to produce film coatings on substrates or chemical sensing devices involve dissolving the coating material in a volatile solvent and applying the solution to the substrate surface by pipetting or spray coating. The substrate surface may be rotated at high speed in a technique called spin coating. These techniques have several disadvantages. It is difficult with the spin coating or spray coating methods to control the coating thickness precisely, or to ensure that the coating is uniform from one batch to another. Spray coating provides no control over the uniformity of a coating over a substrate surface. Spin coating potentially provides a more uniform coating surface than does spray coating, but nevertheless this method has the disadvantage that the edges of the coating tend to be thicker than the interior. If a plurality of devices on a single substrate are coated in a single batch, the devices closer to the outer edge of the substrate will have a thicker coating than the devices closer to the center of the substrate. Further, the spin coating method is difficult to scale up. The spin coating method is also awkward, unwieldy and wasteful for coating large surfaces at one time because of the difficulty of spinning a large substrate and because of the loss of material off the edges of the substrate during the spinning process. Also, the spin coating method is poorly suited for coating discrete areas of a substrate while leaving other areas uncoated, as might be desired when, for example, several devices are to be coated in a single batch or when only the active area of a device is to be coated. Leaving an area of a substrate uncoated in a spin coating process requires the use of tape, which can introduce impurities on a substrate. Moreover, the spray coating and spin coating methods are not useful to create coatings of materials that cannot dissolved in a solvent and are poorly suited for creating multilayer coatings.

Thermal evaporation under a vacuum is another method of creating a film coating. This method is usable only for compounds that do not decompose at the required operating temperature.

More precise and accurate control over the thickness and uniformity of a film coating may be achieved by using pulsed laser deposition (PLD), a physical vapor deposition technique that has been developed recently for forming ceramic coatings on substrates. By this method, a target comprising the stoichiometric chemical composition of the material to be used for the coating is ablated by means of a pulsed laser, forming a plume of ablated material that becomes deposited on the substrate. Although the method is used primarily to create coatings of oxide ceramics such as ferroelectrics, ferrites and high $T_c$ superconductors, it has also been used to create organic or polymer coatings for various uses. U.S. Pat. No. 4,604,294 to Tanaka et al, U.S. Pat. No. 5,192,580 to Blanchet-Fincher and U.S. Pat. No. 5,288,528 to Blanchet-Fincher disclose methods of making organic or polymeric thin films by laser vapor-deposition. In these methods, certain bonds of the organic compound or polymer are photochemically broken, releasing low molecular weight fragments that condense and repolymerize on a substrate. Similar methods are also discussed in Ogale, S. B., "Deposition of Polymer Thin Films by Laser Ablation", in Pulsed Laser Deposition of Thin Films, Chrisey, D. B. and Hubler, G. K., Eds. John Wiley & Sons, New York, 1994, Chapter 25; Hansen S. G. and Robitaille, T. E., "Formation of Polymer Films by Pulsed Laser Evaporation" Appl. Phys. Lett. 52 (1), Jan. 4, 1988, 81–83; Kale et al. "Deposition of Amorphous Fluoropolymers Thin Films by Laser Ablation" Appl. Phys Lett. 62 (5), Feb. 1, 1993, 479–481; Kale et al, "Deposition of Polyphenylene Sulphide (PPS) Polymer by Pulsed Excimer Laser Ablation", Materials Letters 15 (1992) 260–263; and Kale et al "Degradation of $Y_1Ba_2Cu_3O_{7-x}$ Thin Epitaxial Films in Aqueous Medium and Control of Degradation Using Polymer Overlayers Deposited by Pulsed Excimer Laser" Thin Solid Films 206 (1991) 161–164. A method of producing collagen thin films by laser deposition is disclosed in the commonly assigned U.S. patent application Ser. No. 08/655,788. The disclosures of the above patents, patent applications and publications are incorporated herein by reference.

Another factor that affects sensor performance is the chemical composition of the film coating. For some applications, it is desirable that a film coating be created with a minimum of fragmentation, rearrangement, degradation or damage to the material being transferred. This is particularly true in the creation of chemoselective films for chemical sensing devices, since chemical selectivity for a particular analyte often depends on the precise arrangement of substituents on the chemoselective material. A drawback to using conventional pulsed laser deposition in the creation of film coatings is that direct ablation of the target can be stressful and damaging to fragile materials. Chemoselective polymers used as coatings in chemical sensing devices commonly contain sensitive functional groups that can be easily destroyed by bond scission processes or other unwanted reactions if they are exposed to too much energy or stress.

Methods of ablating and ionizing large molecules for mass spectral analysis have been described. U.S. Pat. No. 4,920,264 to Becker, the disclosure of which is incorporated herein by reference, describes a method of desorbing large, nonvolatile, thermally labile molecules from a substrate by laser ablation by combining the large molecule with a solvent and freezing the mixture and then exposing the frozen mixture to laser radiation. The desorbed molecules are ionized and introduced into a mass analysis zone or are introduced into a liquid chromatography interface. U.S. Pat. No. 5,118,937 to Hillencamp et al, the disclosure of which is incorporated herein by reference, describes a method of laser desorption and ionization of large biomolecules by combining the biomolecules with a matrix that absorbs laser light at a wavelength of 300 nm or greater and irradiating the specimen with laser light in the range absorbed by the matrix. The desorbed biomolecules are then ionized and introduced into a mass analyzer. U.S. Pat. No. 5,135,870 to Williams et al, the disclosure of which is incorporated herein by reference, describes a method of pulsed laser ablation and ionization of high molecular weight compounds by combining the compounds with a solvent, freezing the solution, creating a thin film of the frozen solution on a sample stage, and irradiating the sample stage to create a plume containing the high molecular weight compound.

SUMMARY OF THE INVENTION

Accordingly, it is an object of the present invention to provide a method of making a film coating on a substrate wherein the method allows the thickness of the coating to be controlled accurately and precisely.

It is a further object of the present invention to provide a method of making a film coating on a substrate wherein the method produces a uniform coating.

It is a further object of the present invention to provide a method of making a film coating on a substrate wherein the method allows a large area to be coated.

It is a further object of the present invention to provide a method of making a film coating on a substrate wherein the method allows only selected areas of the substrate to be coated.

It is a further object of the present invention to provide a method of making a multilayer film coating on a substrate.

It is a further object of the present invention to provide a method of making a film coating of a chemoselective material by a modified pulsed laser deposition process in a manner so that the chemical composition and chemoselective properties of the chemoselective material is not destroyed or significantly damaged.

It is a further object of the present invention to provide an improved method of making a chemical sensing device of a type that includes a film coating of chemoselective material, whereby the performance of the chemical sensing device is improved.

These and other objects are accomplished by a method of producing a film of a coating material on a substrate comprising the steps of combining a coating material with a matrix material to form a target and exposing the target to a source of laser energy to desorb the matrix material from the target and lift the coating material from the surface of the target. The target and the substrate are oriented with respect to each other so that the lifted coating material is deposited as a film upon said substrate. The matrix material used in the method of the invention is selected to have the property of being more volatile than the coating material and less likely than the coating material to adhere to the substrate in vacuum. The matrix material is further selected as having the property such that when the target is exposed to a source of laser energy, the matrix material desorbs from the target and lifts the coating material from the surface of the target.

The thickness of the film is accurately and precisely controlled by monitoring and controlling the number of laser pulses to which the target is subjected and by adjusting other operating parameters such as incident beam energy, pulsed laser rate, etc. The composition of matrix material and the energy density of the laser may be controlled to minimize the damage to functional groups of the coating material. Moreover, the process may be carried out in an enclosed space and the composition, temperature and pressure of gases contained therein may be controlled to minimize the damage to functional groups of the coating material in flight between ablation and deposition.

A further aspect of the invention is an improved method of making a chemical or biochemical sensing device of the type that is made by the steps of coating the substrate with a film of a sorbent chemoselective or bioselective material and providing means to detect an interaction of the film of the sorbent chemoselective or bioselective material with an analyte, wherein the improvement is to carry out the step of coating the substrate by laser deposition of the chemoselective or bioselective material onto the substrate.

BRIEF DESCRIPTION OF THE DRAWINGS

A more complete appreciation of the invention will be readily obtained by reference to the following Description of the Preferred Embodiments and the accompanying drawings, wherein FIG. 1 is a schematic depiction of an apparatus useful in connection with the practice of the present invention.

FIG. 2 is the Fourier Transform Infrared (FT-IR) spectrum of native SXFA.

FIG. 3 is the Fourier Transform Infrared (FT-IR) spectrum of SXFA film prepared according to the method of the present invention.

DESCRIPTION OF THE PREFERRED EMBODIMENTS

In one aspect, the method of the present invention can be used in any instance where it is desired to form a film of coating material on a substrate. The method is particularly useful in instances where it is desired to form a uniform and adherent film of a chemoselective or bioselective material of controlled thickness on a substrate in a manner that minimizes damage to the chemoselective or bioselective material.

The substrate of the present invention may be any solid surface of any shape, composition and orientation.

The method of the present invention is particularly useful in instances where the substrate is a component of a chemical or biochemical sensing device of the type that includes a substrate, a film coating of a chemoselective or bioselective material on the substrate and a means for detecting the interaction of the chemoselective or bioselective material with a chemical or biochemical analyte. Examples of such devices include surface acoustic wave (SAW) devices, bulk acoustic wave (BAW) devices, plate acoustic wave devices, interdigitated microelectrode (IME) devices, optical waveguide (OW) devices and surface plasmon resonance devices. The composition of the substrate depends upon the type of device. For example, when the substrate is a component of a surface acoustic wave (SAW) device, the substrate typically includes a piezoelectric material.

The coating material may be any material that one may wish to deposit onto a substrate. In a chemical or biochemical sensing device, the coating material will be chosen for its ability to interact selectively with a particular chemical or biological analyte. Criteria for selecting coating materials for chemical sensing devices are described in detail in McGill et al, "Choosing Polymer Coatings for Chemical Sensors", CHEMTECH, Vol 24, No. 9, pp 27–37 (1994), the disclosure of which is incorporated herein by reference. Examples of chemoselective materials include SXFA (poly (oxy {methyl [4-hydroxy-4,4,bis(trifluoromethyl)but- 1-en-1-yl] silylene})), P4V (poly(4-vinylhexafluorocumyl alcohol). In both of these polymers and in other similar polymers, their chemoselectivity is derived from pendant functional groups that extend outward from the polymer backbone. A purpose of the method of the present invention is to create uniform, adherent coatings of these materials without disrupting or damaging the functional groups. Other examples of chemoselective materials include perfluoropolyethers terminated with a variety of functional groups such as $CF_3CH_2OH$, polyethylene imines, polysiloxanes, alkylamino pyridyl substituted polysiloxanes, polytetrafluoroethylene, polysilanes, polyesters, polyvinylaldehydes, polyisobutylene, polyvinylesters, polyalkenes, zeolites, aerogels, porous carbon, metals, silicalites, clay materials, cellulose materials, polyanilines, polythiophenes, polypyrroles, fullerenes, cyclodextrins, cyclophanes, calixeranes, crown ethers, and organic dyes. Examples of biochemical selective materials include antibodies, antigens, DNA, RNA, proteins, oligopeptides, polypeptides, oligosaccharides, polysaccharides, and lipids.

The matrix material is selected to have the property that when it is combined with the coating material to form a target and the target is exposed to a source of laser energy, the matrix material absorbs some of the laser energy in such a manner so that the matrix material is desorbed, thereby lifting or evaporating the coating material from the surface of the target. Preferably, only a thin layer on the surface of the target desorbs at any one time. The matrix material is also selected to be more volatile than the coating material and less likely than the coating material to adhere to the substrate in vacuum. The choice of a particular matrix material will depend on the choice of the coating material. Factors to be taken into consideration in selecting the optimum matrix material for a particular coating material include its ability to dissolve or form a collodial or particulate suspension with the particular coating material, its melting point, heat capacity, molecular size, chemical composition, spectral absorption characteristics, heat of vaporization (factors that affect its ability to desorb and lift the coating material from the target) and its reactivity or nonreactivity towards the coating material. Any laser-produced decomposition products of the matrix material should be nonreactive. Another consideration is any special ability a particular matrix material may have to impart protection to a particular coating material from damage during the lasing, desorption and transfer to the substrate. For example, a matrix material that absorbs laser energy at the same wavelength as an important functional group on the coating material may serve to protect the coating material from damage from exposure to the laser energy. Alternatively, a matrix material may be used that absorbs at a wavelength in a spectral region substantially outside that of the coating material. In this instance, the matrix material absorbs kinetic energy imparted from the laser to the coating material. Preferred matrix materials include water, aryl solvents, especially toluene, acetophenone and nicotinic acid, ketones, alcohols, ethers and esters. Examples of coating material-matrix material combinations that work well are SXFA (poly(oxy{methyl[4-hydroxy-4,4,bis (trifluoromethyl)but-1-en-1-yl] silylene})) (coating material) with t-butanol (matrix material) and P4V (poly(4-vinylhexafluorocumyl alcohol)) (coating material) with acetophenone (matrix material).

The coating material and the matrix material may be combined to form a target in any manner that is sufficient to carry out the purpose of the invention. If the coating material is soluble to some extent in the matrix material, the coating material may be dissolved in the matrix material and then the solution may be frozen to form a solid target. The target may be kept frozen while the surface is being exposed to a source of laser energy during the deposition process. Alternatively, if the coating material is not soluble in a suitable solvent, the coating may be mixed with a matrix material to form a colloidal suspension or condensed phase. The matrix material can also include soluble or insoluble dopants, that is, additional compounds or materials that one may wish to deposit onto the film.

The target may generally be in any shape suitable for being exposed to a laser beam (for example, a pellet, disc, cylinder or parallelepiped). Preferably, the target is a dense, cylindrical pellet. For substrates of a given size, the target should be about four times larger in area.

Apparatus for carrying out the steps of exposing the target to a source of laser energy to desorb the coating material and matrix material and for depositing the coating material on a substrate can be conventional apparatus for pulsed laser deposition as is described in *Pulsed Laser Deposition* of thin Films, edited by D. B. Chrisey and G. K. Hubler (Wiley, New York, 1994) and in Cotell, "Pulsed Laser Deposition and Processing of Biocompatible Hydroxylapatite Thin Films" Appl. Surf. Sci. 69 (1993) pp140–148, the disclosures of which are incorporated herein by reference.

The target may be mounted by any support means. The angle of incidence between the source of laser energy and the target can be any angle used in the art and is typically about 45°. Typically, the target is mounted on a moving support means, such as a rotating and/or translating shaft, such that different portions of the target are in the center of the laser beam at different times, thereby extending the useful lifetime of the target and providing enhanced film uniformity. Typically, the target is rotated at a speed of about 0.05–0.5 revs/s. Such an arrangement allows for greater uniformity of deposition on the substrate. In addition to (or instead of) moving the target, the center of the laser beam can be moved to achieve similar effects. Larger substrate areas may be coated by rastering the center of the laser beam across the target surface. In these cases, targets having diameters >0.75 inch would be preferred.

Any suitable source of laser energy can be employed. In general, as discussed below, a pulsed laser, particularly a short pulsed laser, is preferred in accordance with the present invention. For example, an excimer laser (e.g., ArF, KrF, XeF or XeCl) can be used, an ArF excimer laser being especially preferred. Other short pulsed lasers, e.g., Nd-YAG or $CO_2$, could be used.

Lasers for use in accordance with the present invention generally emit light having a wavelength in the range of about 193 nm–1100 nm, an energy density of about 0.05–10 J/cm$^2$ (typically about 0.1–2.0 J/cm$^2$), a pulsewidth of about $10^{-12}$–$10^{-6}$ second and a pulse repetition frequency of about 0–1000 Hz. In general, energy density (fluence) affects morphology; higher energies tend to produce deposited films that have larger particles.

The distance between the target and the substrate is typically within the range of about 3 cm–10 cm. More often, the distance between the target and the substrate is about 3 cm–5 cm. A particularly preferred distance is about 4 cm. In general, larger distances are more suitable for depositing on larger substrate areas. Distances of greater than 10 cm may be used if desired, for example, for depositing on larger surface areas. However, the target-substrate distance is also inversely related to the film thickness achieved for a given period of deposition. The substrate may be manipulated, such as by rotation or translation, during deposition to allow deposition on non-planar or irregularly shaped surfaces. If the coating material used in the practice of the invention is a polymer, a more uniform coating may be created by heating the substrate to a temperature above the glass transition or melting point of the polymer while the coating material is being deposited on the substrate.

The target and the substrate are preferably positioned within an enclosed space or chamber, referred to as a "PLD chamber", having an environment whose temperature, pressure and chemical composition are controlled to enhance the deposition process and to minimize the likelihood of damage to the coating material. Suitable environments according to the present invention may include argon, and argon/water, oxygen, alkanes, alkenes, alkynes, alcohols or a mixture of these gases. A gas having the same chemical composition as the matrix material may be used. Other non-reactive or inert gases may be substituted for argon. For creating a gas/water environment, there may be provided a gas inlet port which passes through a bubbler before passing into a vacuum chamber. For creating a water-free environment, there may be provided a gas inlet port which passes directly into a vacuum chamber. If desired, the chamber atmosphere may be changed at the end of a deposition process to bring the substrate to atmospheric conditions. Gases present before and during the deposition process may be referred to as "make-up gases." The gases introduced into the chamber at the end of deposition may be referred to as "quenching gases."

The background pressure within the chamber during deposition determines the rate at which the film of coating material is deposited on the substrate. Generally, the lower the pressure, the faster the deposition. As the pressure within the chamber increases, the number of collisions between the ablated coating material and the gas increases. These collisions slow the deposition process, resulting in thinner films. Generally, the background pressure within the chamber during a deposition may be about 0 Torr–760 Torr. Typically, deposition is performed below atmospheric pressure. A preferred range for the total pressure within the chamber during deposition is about 0.05 Torr–50 Torr. A particularly preferred range is about 0.1 Torr to 1 Torr.

The thickness of the deposited film is proportional to the number of laser pulses to which the target is exposed and, consequently, to the time of deposition for a given laser pulse rate. The film thickness may be selected by controlling the number of laser pulses depending on the purpose for which the finished article is to be used. A typical range of thicknesses for acoustic wave devices is from about 1 nm to about 10 microns. The thickness of the film may also be controlled by selecting factors such as the laser energy density, the target temperature and the distance of the substrate from the target.

In the manufacture of an acoustic wave device, the thickness of the coating material during the deposition process may be monitored by operating an acoustic wave device having an initial predetermined oscillating frequency. The change in the frequency of the acoustic wave as the coating material is deposited on the substrate may be monitored in real time and the deposition process halted when the frequency changes to a second predetermined level.

The method of the present invention is particularly suitable for making film coatings on relatively large substrate areas (up to about six inches in diameter). To make numerous chemical sensing devices at one time, a single large substrate can be coated at one time and then the coated substrate can be subdivided into separate chemical or biochemical sensing device components. The substrate may be masked so that only predetermined areas of the substrate are coated.

The method of the present invention may be used to make multi-layer devices by repeating the steps of producing the film coating on a substrate using different coating materials.

FIG. 1 shows a typical apparatus 100 useful for carrying out the method of the present invention. Vacuum chamber 10 with a base pressure of about $4 \times 10^{-8}$ Torr encloses the apparatus. Excimer laser 12 is focused through lens 14 onto target 16 made of the coating material and the matrix material. Target 16 is affixed to rotating arm 18 which allows plume 20 to be precessed over substrate 22, thus covering a wider area than a fixed arm geometry would allow. Substrate holder 24 is electrically isolated and may be heated by means of quartz lamp 26. The temperature is monitored by thermocouple 28. Gas inlet port 30 allows the introduction of gases into chamber 10 in the direction of arrow 31. Bubbler 32 (optional) may be used when a water vapor environment is desired.

In an alternative embodiment, the invention relates specifically to an improved method of making a chemical or biochemical sensing device by the steps of (a) providing a substrate (b) coating the substrate with a film of a chemoselective or bioselective material, the film having a uniform thickness over a substantial portion of the substrate and (c) providing means to detect an interaction of the film of the chemoselective or bioselective material with an analyte, wherein the step of coating the substrate with a film of chemoselective or bioselective material is by the technique of pulsed laser deposition as described above. The chemoselective or bioselective material may be combined with a matrix material as described above, but if the chemoselective or bioselective material is able to withstand the conditions for pulsed laser deposition, this step may be omitted. Examples of chemoselective materials that can be used in the formation of a chemical sensing device without combining the material with a matrix material include polyolefins such as polyisobutylene, polyhalogenated olefins, polyhalogenated ethers, in particular, polyepichlorohydrin, perfluorinated polymers, particularly polytetrafluoroethylene and porous inorganic materials such as activated carbon, clays, zeolites and aerogels.

Having described the invention, the following examples are given to illustrate specific embodiments of the invention including the best mode now known to perform the invention. These specific examples are not intended to limit the scope of the invention described in this application.

EXAMPLE 1

A solution of SXFA (poly(oxy{methyl[4-hydroxy-4,4,bis (trifluoromethyl)but-1-en-1-yl] silylene})) in t-BuOH (tertiary butyl alcohol) was prepared at a concentration of 0.005 g of polymer/g of matrix material. This solution was poured into a cylindrical teflon lined lid and frozen in liquid nitrogen. The frozen SXFA(tBuOH) solution in the lid was transferred to the PLD chamber as the target. The open end of the lid was secured in such a position to expose the surface of the frozen SXFA(tBuOH) solution to the laser. The PLD conditions were as follows:

| | |
|---|---|
| Type of Laser | KrF, 248 nm |
| Laser Power(W) @ 10Hz | 0.20 |
| Energy Density (J/cm2) | 0.45 |
| Repetition rate(Hz) | 5 |
| Spot Size(cm$^2$) | 0.045 |
| Laser Voltage(kV) | 14.7 (Constant Energy Mode:375mJ) |
| Substrate | NaCl Plate |
| Substrate Temperature (°C.) | 25° C. |
| Make Up Gas | Water & Argon |
| Make Up Gas Pressure(torr) | 0.050 |
| Substrate-Target Distance | 3 cm |
| Number of Shots | 21,000 |

Figure 2:
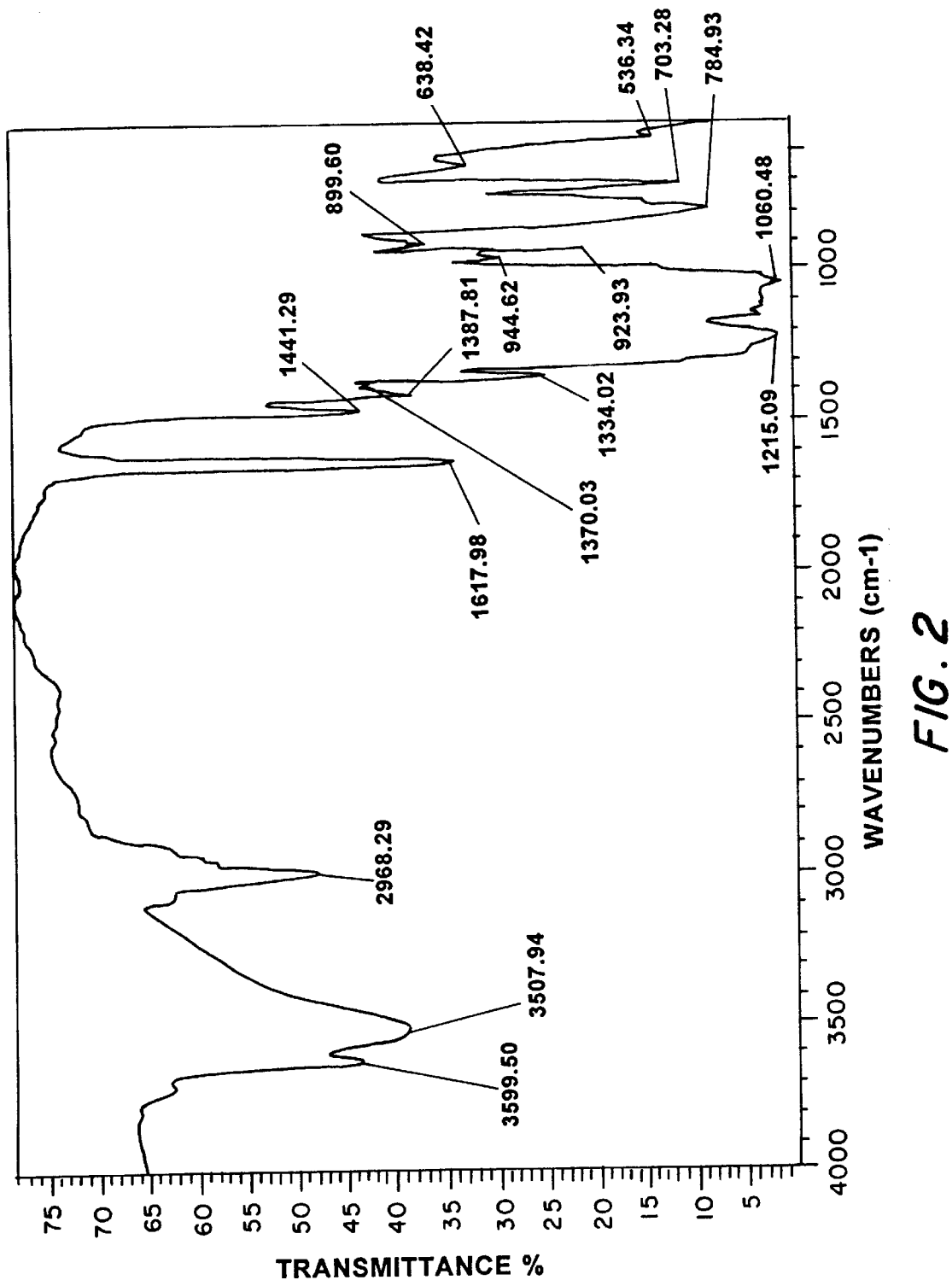
Figure 3:
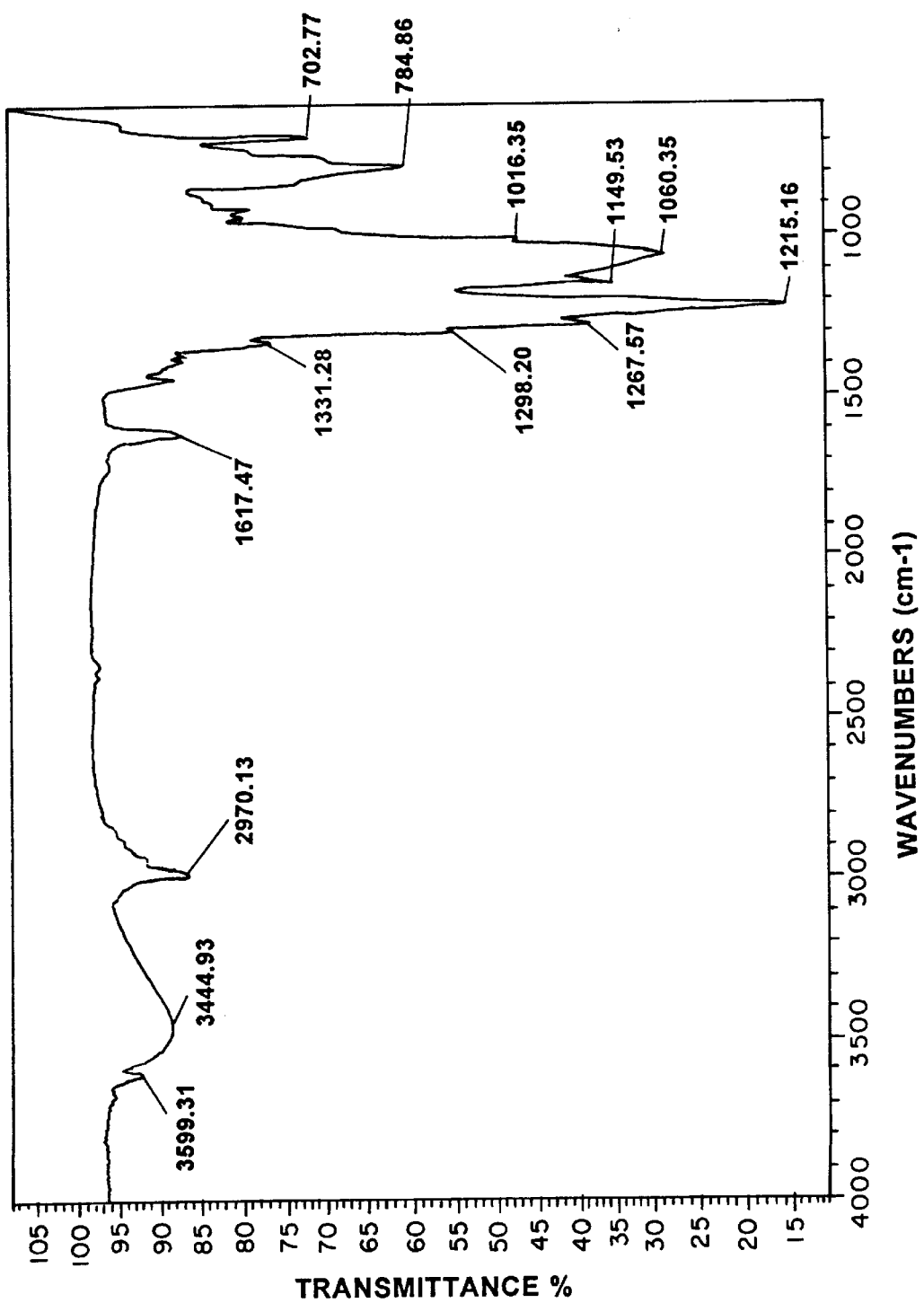

Water vapor was generated by bubbling argon through water maintained at about 25° C. The argon stream was therefore nearly saturated with water vapor. The deposition was stopped at 20,000 shots and the repetition rate increased to 10 Hz and an additional 1000 shots added. A comparison of FIG. 2 (native SXFA) and FIG. 3 (PLD-deposited SXFA) shows that functional groups of native SXFA are preserved in the PLD process.

EXAMPLE 2

A solution of poly(4-vinylhexafluorocumyl alcohol) (P4V) in acetophenone (ACPH) was prepared at the concentration of 0.0056 g/g. This solution was poured into a cylindrical teflon lined lid and frozen in liquid nitrogen. The frozen P4V(ACPH) solution in the lid was transferred to the PLD chamber as the target. The open end of the lid was secured in such a position to expose the surface of the frozen P4V(ACPH) solution to the laser. The PLD conditions were as follows:

| | |
|---|---|
| Type of Laser | KrF, 248 nm |
| Laser Power(W) @ 10Hz | 0.20 |
| Energy Density (J/cm2) | NA |
| Repetition rate(Hz) | 5 |
| Laser Voltage(kV) | 16.2 (Constant Energy Mode:375mJ) |
| Substrate | NaCl Plate |
| Substrate Temperature (°C.) | 25° C. |
| Make Up Gas | Water & Argon |
| Make Up Gas Pressure(torr) | 0.050 |
| Substrate-Target Distance | 3 cm |
| Number of Shots | 21,000 |

Water vapor was generated by bubbling argon through water. The argon stream was therefore nearly saturated with water vapor. The deposited coating appeared to add a tinted sheen to the surface.

A comparison of the FT-IR spectra of native and PLD-deposited P4V showed that functional groups of the P4V were preserved in the deposition process. (data not shown)

EXAMPLE 3

A 2 port (launch and receive) 250 MHz SAW resonator was coated with a film of SXFA by the PLD method described above to create a coating having a thickness such that the frequency of the device was shifted by 235 KHz during the deposition process. The insertion loss of the device was determined to be 13 db. The insertion loss of a similar device created using conventional coating methods is determined to be between 16 to 20 db. With no polymer coating these SAW devices typically exhibit insertion loss values of between 8 to 10 db. The theoretical value is about 6 db. The PLD coated device yields insertion loss values that are at about 50% less than using conventional coating techniques. This is advantageous because the gain required to operate the SAW device does not have to be as strong. More coating can be deposited without significantly impairing the operational ability of the device.

EXAMPLE 4

A flat clean 1 cm$^2$ Si (111) substrate wafer was coated with polyepichlorohydrin (PECH) under the following conditions:

| | |
|---|---|
| Type of Laser | KrF, 248 nm |
| Laser Power(W) @ 10Hz | 0.20 |
| Energy Density (J/cm2) | 0.5 |
| Repetition rate(Hz) | 5 |
| Laser Voltage(kV) | 14.8 (Constant Energy Mode:375mJ) |
| Substrate Temperature (°C.) | 25° C. |
| Make Up Gas | N$_2$/H$_2$ |
| Make Up Gas Pressure(torr) | .05 |
| Substrate-Target Distance | 3 cm |
| Number of Shots | 29,000 |

The PECH Coated Si (111) wafer was analyzed with a J.A. Woolam Co. focused beam M-44™ ellipsometer and VASE® (variable angle spectroscopic ellipsometer). The thickness of the PECH coating in a linear direction was sampled across the 1 cm$^2$ substrate. The coating thickness was determined to be 2087+/−48 Angstroms.

EXAMPLE 7

An uncoated 250 MHz surface acoustic wave (SAW) device was placed in a vacuum chamber at a pressure of about 50 millitorr at room temperature. A target of polyepichlorohydrin (PECH) was exposed to a Kr—F pulsed laser (248 nm) to transfer the PECH from the target to the active area of the surface acoustic wave device, which was placed 4 cm from the target to create a 32 nm film of the PECH on the device. Performance of the SAW device when exposed to dimethylmethylphosphorate and bis-2-chloroethylether gases compared with the performance of a SAW device created by the conventional means of spray coating with PECH in a solvent. The SAW device coated by pulsed laser deposition showed greater sensitivity, faster sensor signal response, and a more rapid recovery of the sensor signal to a baseline value upon exposure to clean air in comparison to the spray-coated SAW device.

Obviously, many modifications and variations of the present invention are possible in light of the above teachings. It is therefore to be understood that, within the scope of the appended claims, the invention may be practiced otherwise than as specifically described.

What is claimed is:

1. A method of producing a film of a coating material on a substrate comprising the steps of
   (a) combining a coating material with a matrix material to form a target, the matrix material having the property of being more volatile than the coating material and less likely than the coating material to adhere to the substrate in vacuum and the matrix material being selected as having the property such that when the target is exposed to a source of laser energy, the matrix material desorbs from the target, thereby lifting the coating material from the surface of the target, and
   (b) exposing the target to a source of laser energy to desorb the matrix material from the target and lift the coating material from the surface of the target, the target and the substrate being oriented with respect to each other such that the lifted coating material is deposited as a film upon said substrate.

2. The method of claim 1 wherein the coating material is a polymeric substance.

3. The method of claim 2 wherein the substrate is heated to a temperature above the glass transition or melting temperature of the polymer.

4. The method of claim 1 wherein the coating material is a sorbent chemoselective or bioselective material.

5. The method of claim 4 wherein the sorbent chemoselective material is selected from the group consisting of perfluoro-polyethers, polyethylene imines, polysiloxanes, alkylamino pyridyl substituted polysiloxanes, polytetrafluoroethylene, polysilanes, polyesters, polyvinylaldehydes, polyisobutylene, polyvinylesters, polyalkenes, zeolites, aerogels, porous carbon, metals, silicalites, clay materials cellulose materials, polyanilines, polythiophenes, polypyrroles, fullerenes, cyclodextrins, cyclophanes, calixeranes, crown ethers, and organic dyes.

6. The method of claim 1 wherein the matrix material is a solvent and wherein the step of combining the coating material with a matrix material to form a target includes the steps of dissolving the coating material in the solvent and freezing the solution.

7. The method of claim 6 wherein the solvent is an aryl solvent.

8. The method of claim 6 wherein the coating material is poly(oxy{methyl[4-hydroxy-4,4,bis(trifluoromethyl)but-1-en-1-yl] silylene}) and the matrix material is t-butanol.

9. The method of claim 6 wherein the coating material is poly(4-vinylhexafluorocumyl alcohol) and the matrix material is acetophenone.

10. The method of claim 1 wherein the step of combining the coating material with a matrix material is accomplished by mixing the coating material and the matrix material to form a colloidial or particulate suspension of the coating material in the matrix material.

11. The method of claim 10 wherein the matrix material is selected from the group consisting of water, aromatic compounds, alcohols and alkanes.

12. The method of claim 10, wherein the matrix material is selected from the group consisting of zeolites, aerogels, silicalites, porous carbons and clays.

13. The method of claim 1 wherein the source of laser energy is a pulsed laser.

14. The method of claim 13 wherein the source of laser energy is a Kr—F excimer laser with a wavelength of 248 nm.

15. The method of claim 1 wherein the film has a thickness of from about 1 nm to about 100 µm.

16. The method of claim 1 including the step of masking the substrate so that the film is deposited only on preselected portions of the substrate.

17. The method of claim 1 wherein the substrate includes a piezoelectric material.

18. The method of claim 1 wherein the substrate is a component of a chemical or biochemical sensing device.

19. The method of claim 1 wherein the substrate is a component of an acoustic wave device.

20. The method of claim 1 wherein steps (a) and (b) are repeated with different coating materials to create a multi-layer film on the substrate.

21. In a method of making a chemical sensing device by the steps of
   (a) providing a substrate
   (b) coating the substrate with a film of a chemoselective or bioselective material and (c) providing means to detect an interaction of the film of the chemoselective or bioselective material with an analyte, the improvement comprising carrying out the step (b) of coating the substrate with a film of chemoselective or bioselective material by the substeps of (i) providing a target comprising the chemoselective or bioselective material, (ii) exposing the target to a source of laser light to desorb the chemoselective or bioselective material from the surface of the target, the target and the substrate being oriented with respect to each other such that the desorbed chemoselective or bioselective material is deposited as a film upon said substrate, the film having a uniform thickness over a substantial portion of the substrate.

22. The method of claim 21 wherein the chemical sensing device is an acoustic wave device.

23. The method of claim 22 wherein a surface acoustic wave having an initial frequency of about 250 MHz is propagated over the surface of the substrate, the frequency shifting as the film is deposited thereon, and wherein the substep (ii) of exposing the target to a source of laser light and depositing a thin film on the substrate is carried out until the frequency shifts by about 0–3% of the initial frequency.

24. The method of claim 21 wherein the film has a variation in thickness across an area of 1 $cm^2$ of less than plus or minus 5%.

25. The method of claim 21 wherein the substep (i) of providing a target comprising the chemoselective material includes combining the chemoselective material with a matrix material.

26. The method of claim 21 wherein the film is deposited to a thickness of from 1 nm to 100 $\mu$m.

27. The method of claim 21 wherein the chemoselective material is selected from the group consisting of polyolefins, polyhalogenated olefins, polyhalogenated ethers, and perfluorinated polymers.

28. The method of claim 21 wherein the chemoselective material is selected from the group consisting of activated carbon, porous carbonaceous material, silicates, clays, zeolites and aerogels.

* * * * *